(12) United States Patent
Asada et al.

(10) Patent No.: US 10,571,801 B2
(45) Date of Patent: Feb. 25, 2020

(54) COATING APPARATUS, IMPRINT APPARATUS, AND METHOD OF MANUFACTURING ARTICLE

(71) Applicant: CANON KABUSHIKI KAISHA, Tokyo (JP)

(72) Inventors: Kunihiko Asada, Utsunomiya (JP); Tomohiro Harayama, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 953 days.

(21) Appl. No.: 14/955,270

(22) Filed: Dec. 1, 2015

(65) Prior Publication Data

US 2016/0161868 A1 Jun. 9, 2016

(30) Foreign Application Priority Data

Dec. 9, 2014 (JP) .................................. 2014-248742

(51) Int. Cl.
*G03F 7/00* (2006.01)
*B29K 105/00* (2006.01)

(52) U.S. Cl.
CPC .... *G03F 7/0002* (2013.01); *B29K 2105/0058* (2013.01)

(58) Field of Classification Search
None
See application file for complete search history.

(56) References Cited

U.S. PATENT DOCUMENTS

| 6,056,387 A | 5/2000 | Kaneko | |
|---|---|---|---|
| 2012/0013849 A1* | 1/2012 | Podoleanu | A61B 3/1005 351/221 |
| 2013/0288404 A1* | 10/2013 | Nonomura | H01L 33/0095 438/16 |
| 2015/0042012 A1* | 2/2015 | Nakagawa | G03F 7/0002 264/293 |

FOREIGN PATENT DOCUMENTS

| JP | 0760954 A | 3/1995 | |
|---|---|---|---|
| JP | 07246708 A | 9/1995 | |
| JP | H07-246708 | * 9/1995 | .......... B41J 2/16579 |
| JP | 11291476 A | 10/1999 | |
| JP | 2005026462 A | 1/2005 | |

(Continued)

OTHER PUBLICATIONS

Office Action issued in Japanese Appln. No. 2015-237233 dated Aug. 27, 2019. English translation provided.

*Primary Examiner* — Stella K Yi
(74) *Attorney, Agent, or Firm* — Rossi, Kimms & McDowell LLP

(57) ABSTRACT

Provided is a coating apparatus that includes: a discharge unit that discharges a liquid on an object; a measurement unit that is able to be disposed at a position facing a discharge surface of the discharge unit and measures a height position of the discharge surface using the facing position as a reference position; and a controller that calculates a thickness of an attached substance containing a material of the liquid attached to the discharge surface based on the height position measured by the measurement unit and determines implementation of a maintenance treatment based on the calculated thickness of the attached substance.

17 Claims, 6 Drawing Sheets

(56) References Cited

FOREIGN PATENT DOCUMENTS

| | | | | |
|---|---|---|---|---|
| JP | 2008254200 | A | 10/2008 | |
| JP | 2011192917 | A | 9/2011 | |
| JP | 2013-188737 | * | 9/2013 | ............. B05C 11/10 |
| JP | 2013188737 | A | 9/2013 | |
| WO | WO-2013128888 | A1 * | 9/2013 | ........... G03F 7/0002 |

* cited by examiner

COATING APPARATUS, IMPRINT APPARATUS, AND METHOD OF MANUFACTURING ARTICLE

BACKGROUND OF THE INVENTION

Field of the Invention

The present invention relates to a coating apparatus, an imprint apparatus, and a method of manufacturing an article.

Description of the Related Art

There are microfabrication technologies for forming a pattern to an imprint material on a substrate using a mold. These technologies are also called imprint technologies in which a nanoscale pattern (structure) can be formed on a substrate. For example, one of the imprint technologies is a photocuring method. In imprint apparatuses employing the photocuring method, first, a photocuring resin acting as an imprint material is supplied to a shot region on a substrate. Next, the imprint material on the substrate is molded using a mold. Then, after light is applied to cure the imprint material, the mold is released, and thereby a pattern of the imprint material is formed on the substrate. In addition to the photocuring method, the imprint technologies include, for instance, a thermosetting method of curing an imprint material using heat.

The imprint material is supplied to (coated on) the shot region on the substrate by a dispenser. This dispenser serves as a component of a coating apparatus, and discharges the imprint material in the form of a liquid according to, for instance, an inkjet method. A configuration of the dispenser is similar to that of an ink jet head that is generally used in an ink jet printer. Here, when the material such as the imprint material is attached to a discharge surface of the ink jet head, this may cause a decrease in discharge performance (e.g., a decrease in discharge position accuracy or stability or clogging of a discharge opening). Therefore, an ink jet recorder is disclosed in Japanese Patent Laid-Open No. H07-60954, in which electric wiring is provided around a discharge opening, and a variation in resistance value when ink is attached to the electric wiring is measured, thereby previously detecting leakage of the ink. Also, an ink jet recording device is disclosed in Japanese Patent Laid-Open No. H07-246708 in which light is applied to and reflected from a discharge surface, and an intensity of the reflected light is measured by an optical sensor, thereby previously detecting leakage of ink.

However, in the techniques disclosed in Japanese Patent Laid-Open Nos. H07-60954 and H07-246708, it is possible to detect abnormality of the discharge surface, i.e. whether the discharged material such as the liquid is not attached to the discharge surface, but it is difficult to specifically measure a thickness of the liquid attached to the discharge surface. This implies that it is difficult to determine whether to perform maintenance according to a degree of, for instance, the material attached to the discharge surface. Therefore, in all cases in which the material such as the liquid is attached to the discharge surface, if the maintenance is performed with no exception without the above determination, the maintenance may be performed even when no influence would be exerted on a discharge operation of discharging the liquid even if the maintenance were not actually performed. Such undue maintenance is not favorable because it leads to an increase in maintenance time (a decrease in operable time for an imprint operation) as well as damage to the discharge surface caused by the maintenance.

SUMMARY OF THE INVENTION

The present invention provides, for instance, a coating apparatus that is advantageous to optimization of a maintenance treatment.

The present invention provides a coating apparatus having a holder for holding an object and a discharge unit for discharging droplets on the object held by the holder. The coating apparatus includes: a measurement unit that is able to be disposed at a position facing a discharge surface of the discharge unit and measures a height position of the discharge surface using the facing position as a reference position; and a controller that calculates a thickness of an attached substance containing a material of the liquid attached to the discharge surface based on the height position measured by the measurement unit and determines implementation of a maintenance treatment based on the calculated thickness of the attached substance.

Further features of the present invention will become apparent from the following description of exemplary embodiments (with reference to the attached drawings).

DESCRIPTION OF THE EMBODIMENTS

Hereinafter, embodiments for carrying out the present invention will be described with reference to the drawings.

First, a coating apparatus according to an embodiment of the present invention will be described. The coating apparatus according to the present embodiment is an apparatus that discharges (supplies) droplets (liquid) of an uncured resin or ink onto an object, and will be described as being installed on an imprint apparatus acting as a lithography apparatus forming (transferring) a pattern on a substrate. The coating apparatus of the present invention is not limited to the imprint apparatus, includes industrial apparatuses such as an apparatus for manufacturing, for instance, a semiconductor device or a liquid crystal display device and consumer products such as a printer, and can be widely applied to apparatuses having a mechanism discharging droplets.

Figure 1:
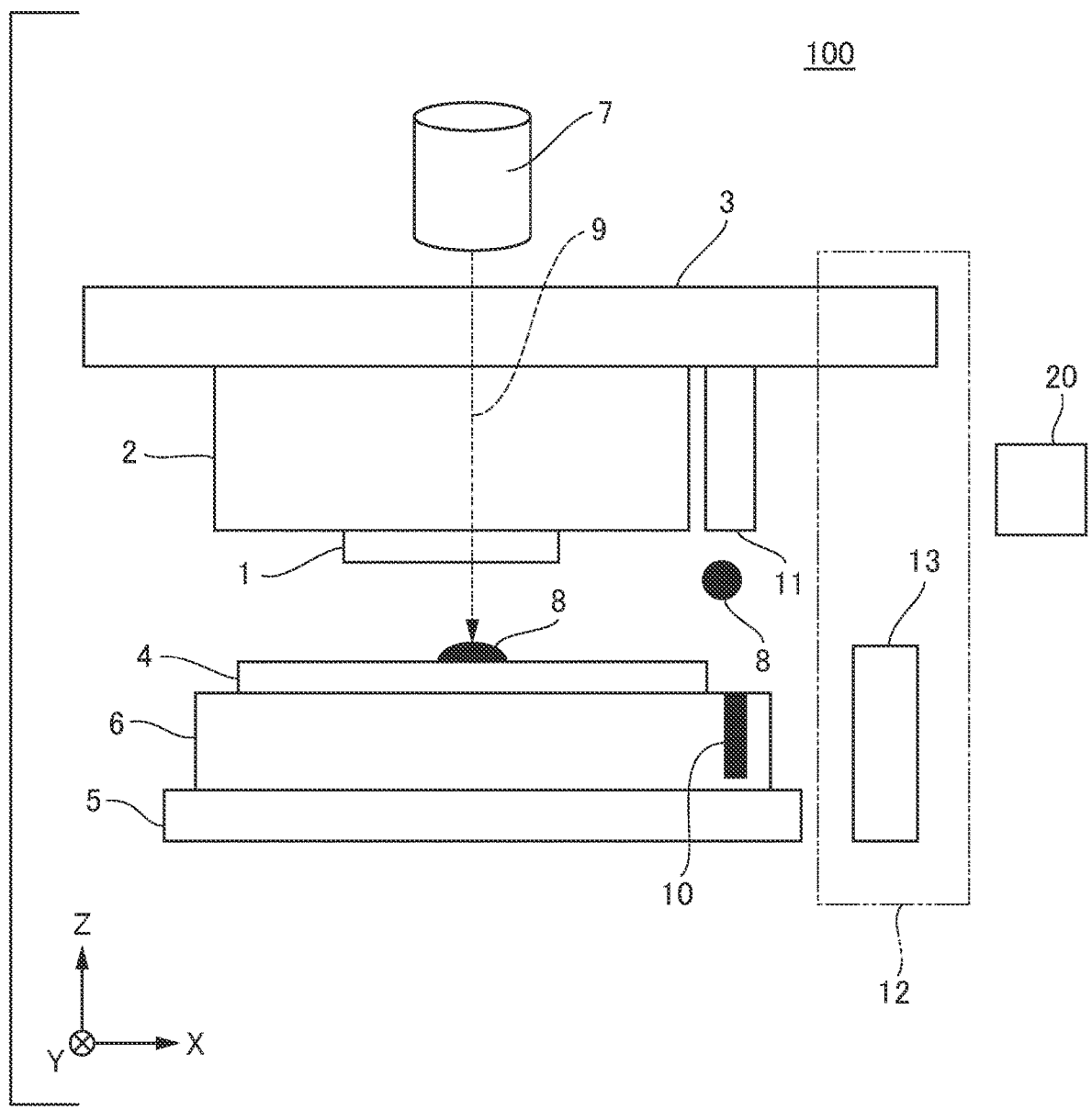
FIG. 1 is a view illustrating a configuration of an imprint apparatus according to an embodiment.

FIG. 1 is a schematic view illustrating a configuration of an imprint apparatus 100 equipped with the coating apparatus according to the present embodiment. The imprint apparatus 100 is used to manufacture a semiconductor device, etc. as an article, brings an uncured resin (imprint material) 8 coated on a wafer (substrate) 4 into contact with a mold 1, and forms a pattern to the resin 8 on the wafer 4. Further, the imprint apparatus 100 is adapted to employ a photocuring method of applying, in one instance, ultraviolet light to cure the resin 8. The present invention may also be applied to an imprint apparatus for curing a resin using other energy (e.g., heat). Also, in the following drawings, a Z axis is assumed to be oriented in an upward/downward direction (vertical direction), and X and Y axes orthogonal to each other are within a plane perpendicular to the Z axis. The imprint apparatus 100 is equipped with an illumination system 7, a mold holding mechanism 2, a wafer stage 6, a dispenser 11, a position measuring instrument 10 that measures a position of a nozzle surface of the dispenser 11, and a controller 20. The coating apparatus according to the present embodiment may be regarded as a unit including the wafer stage 6, the dispenser 11, the position measuring instrument 10, and the controller 20 among them.

The illumination system 7 is a resin curing means for modulating ultraviolet light emitted from a light source (not illustrated) to light (ultraviolet light 9) suitable for curing the resin 8 and applying the modulated light to the mold 1. Here, for instance, a mercury lamp generating i-rays and g-rays may be employed as the light source. However, the light source is not limited to ultraviolet light, and need only emit light of wavelengths that are transmitted through the mold 1 and cure the resin 8. When a thermosetting method is employed, in place of the illumination system 7, for instance, a heating means for curing a thermosetting resin may be installed around the wafer stage 6 as a resin curing means.

The mold 1 has a rectangular planar shape and a fine uneven pattern formed in the middle of a surface facing the wafer 4 in a three-dimensional shape. A material of the mold 1 is a material such as quartz capable of transmitting the ultraviolet light.

The mold holding mechanism (mold holder) 2 is supported by a structure 3. Although not illustrated, the mold holding mechanism 2 includes a mold chuck that holds the mold 1 and a mold driving mechanism that supports and shifts the mold chuck. The mold chuck holds the mold 1 by pulling an outer circumferential region of the applied plane of the ultraviolet light 9 within the mold 1 using a vacuum suction force or an electrostatic force. The mold driving mechanism shifts the mold 1 (or the mold chuck) in a Z-axial direction to bring the mold 1 and the resin 8 on the wafer 4 into contact with each other or to pull them apart from each other. The abutting and releasing operations in the event of an imprint method may be realized by driving the wafer stage 6 to shift the wafer 4 in the Z-axial direction, or by relatively shifting both the mold 1 and the wafer 4.

The wafer 4 is a substrate (object) to be processed which is formed of, for instance, single-crystal silicon. If the substrate is used to manufacture articles other than a semiconductor device, a material of the substrate may employ, for instance, optical glass such as quartz if it is used for an optical element, and GaN or SiC if it is used for a light-emitting element.

The wafer stage (substrate holder) 6 holds the wafer 4 to be movable on a stage surface plate 5 within an XY plane, and carries out alignment between the mold 1 and the wafer 4 in the event of contact between the mold 1 and the resin 8 on the wafer 4.

The dispenser (discharge unit) 11 is supported by the structure 3, and coats the uncured resin 8 (i.e. discharges droplets of the resin 8) on a shot region (pattern forming region) preset on the wafer 4 using a desired coating pattern. The dispenser 11 includes a nozzle (discharge opening) 14 that employs a so-called ink jet method to discharge the resin 8, and a container that contains the resin 8 but is not illustrated. The resin 8 acting as the imprint material is required to have fluidity when filled between the mold 1 and the wafer 4 and to be a solid maintaining a shape after being molded. Especially, in the present embodiment, the resin 8 is an ultraviolet-curing resin (photocuring resin) having a characteristic of being cured by receiving the ultraviolet light 9. However, depending on various conditions of, for instance, an article manufacturing process, a thermosetting resin or a thermoplastic resin may be used instead of the photocuring resin.

The position measuring instrument (position measuring unit) 10 measures a position of a nozzle surface (discharge surface) on which a nozzle 14 of the dispenser 11 is formed. Here, the position of the nozzle surface refers to, in the present embodiment, a height position in the Z-axial direction (direction in which the mold 1 and the resin 8 on the wafer 4 come into contact with each other). Therefore, the position measuring instrument 10 is preferably adapted to be disposable at a position facing the nozzle surface of the dispenser 11 in the Z-axial direction. In the present embodiment, as an example, the position measuring instrument 10 is installed on a surface of the wafer stage 6 which is located at a side to which the ultraviolet light 9 is applied. Also, for instance, a spectral interferometer may be employed as the position measuring instrument 10. However, if the position measuring instrument 10 is assumed to be installed on the wafer stage 6, the position measuring instrument 10 may be used in combination with, for instance, a height measuring instrument (height measuring unit) that measures a Z-axial height position of the mold 1 which is generally employed.

The controller 20 is configured of, for instance, a computer, is connected to each component of the imprint apparatus 100 via a circuit, and can control an operation and adjustment of each component according to, for instance, a program. Especially, in the present embodiment, the controller 20 can perform the imprint method including the maintenance process as illustrated below. Further, the controller 20 may be formed integrally with the other portions of the imprint apparatus 100 (in a common housing), or separately from the other portions of the imprint apparatus 100 (in a separate housing).

Next, the imprint method according to the imprint apparatus 100 will be roughly described. First, the wafer stage 6 holds the wafer 4 to be processed, and then moves to a position at which the wafer 4 faces the nozzle 14 of the dispenser 11. Here, the dispenser 11 discharges a predetermined amount of resin 8 from the nozzle 14 during the movement of the wafer stage 6, thereby coating the resin 8 onto a desired position on the wafer 4 (coating process). Next, a height position of the nozzle surface of the dispenser 11 is measured using the height measuring instrument installed on the wafer stage 6, thereby adjusting a Z-axial gap between the dispenser 11 and the wafer stage 6 prior to an abutting process (gap adjusting process). Since the coating of the resin 8 by the dispenser 11 is performed while the wafer stage 6 is driven in a scanning fashion, the gap adjusting process is a process required from the viewpoint of a flight distance of droplets of the resin 8, and can improve impact accuracy of the droplets as the gap becomes narrow. Subsequently, the wafer stage 6 moves to a position at which a portion on the wafer 4 coated with the resin 8 faces the uneven pattern of the mold 1. Then, the mold driving mechanism shifts the mold 1 to be directed to the wafer 4 in the Z-axial direction, and keeps the mold 1 and the wafer 4 close to each other. In this state, an alignment scope (not illustrated) detects an alignment mark on the mold 1 and an alignment mark on the wafer 4, superposes the alignment marks by movement of the wafer stage 6 based on the detected result, and adjusts a relative position between the two. Next, the mold driving mechanism shifts the mold 1 to reduce an interval between the mold 1 and the wafer 4, and brings the resin 8 on the wafer 4 and the uneven pattern of the mold 1 into contact with each other (abutting process). Subsequently, the illumination system 7 applies the ultraviolet light 9 to cure the resin 8 (curing process). Therefore, the mold driving mechanism shifts the mold 1 in a direction in which the mold 1 is separated from the wafer 4 after the resin 8 is cured, and increases an interval between the mold 1 and the cured resin 8 (wafer 4), thereby pulling the mold 1 apart from the resin 8 on the wafer 4 (releasing process). Thereby, a pattern corresponding to the uneven pattern of the mold 1 is formed (transferred) on the resin 8 on the wafer 4, and the imprint method is completed.

In general, in the coating process as described above, if the dispenser continues to discharge the resin, the resin (attached substance containing a material of the resin) is attached to the nozzle surface. The resin attached to the nozzle surface is a liquid or a cured product. Thus, if the imprint method as described above is repeated, this may exert an influence on a discharge operation, the resin attached to the nozzle surface may become a liquid film, or the resin may fall in drops when the liquid does not withstand surface tension, and result in generating contamination in the imprint apparatus. With regard to this, detecting attachment of the resin to the nozzle surface and performing maintenance such as cleaning when the resin is attached can be considered. However, if the maintenance is performed with no exception due to the attachment of the resin, the maintenance may be performed even when no influence would be exerted on the discharge operation even if the maintenance were not actually performed. Therefore, in the present embodiment, the controller 20 determines whether to perform maintenance treatment on the dispenser 11 based on a thickness of the resin attached to the nozzle surface.

Figure 2:
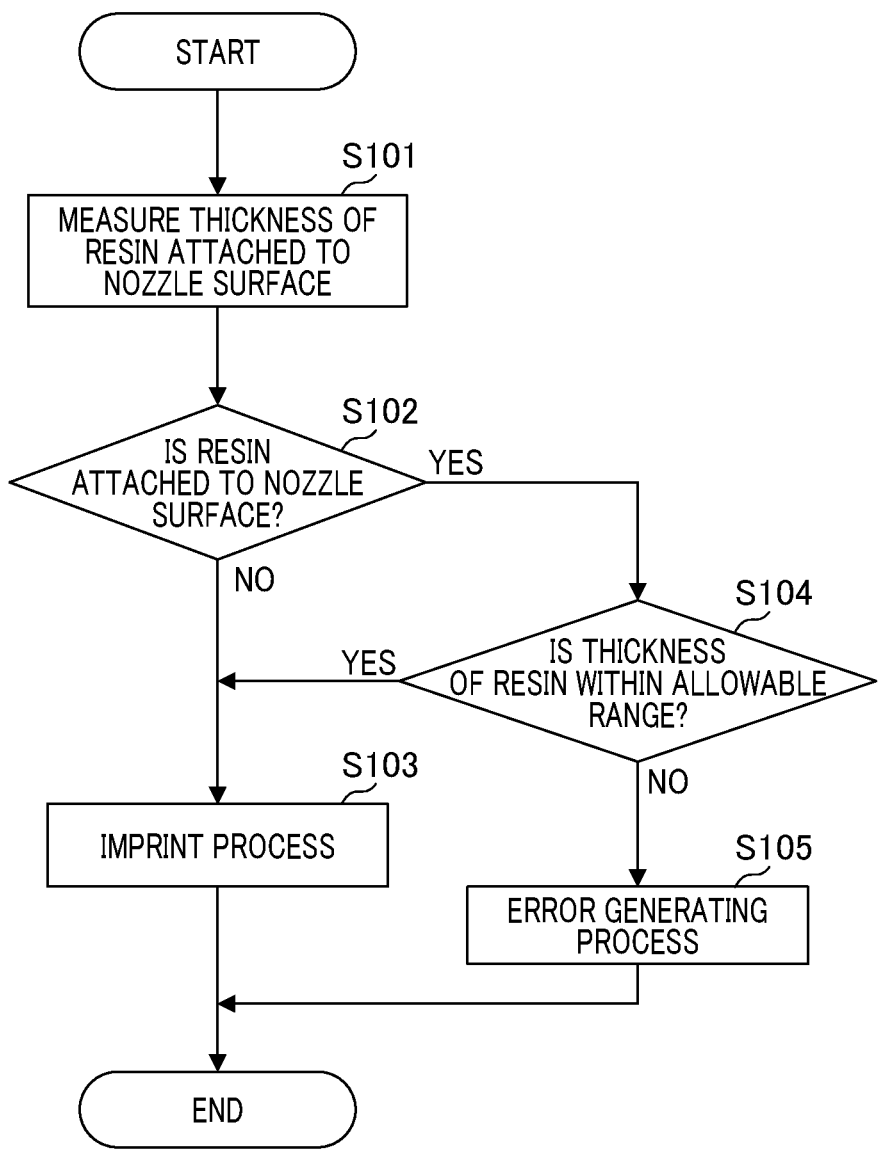
FIG. 2 is a flow chart illustrating a flow of an imprint method.

FIG. 2 is a flow chart illustrating a flow of the imprint method including the maintenance process of the dispenser 11 in the present embodiment. First, the controller 20 calculates a thickness of the resin 8 attached to the nozzle surface of the dispenser 11 before the imprint process performed in step S103 below (all the processes up to the releasing process described above) (resin thickness calculating process: step S101).

Figure 3:
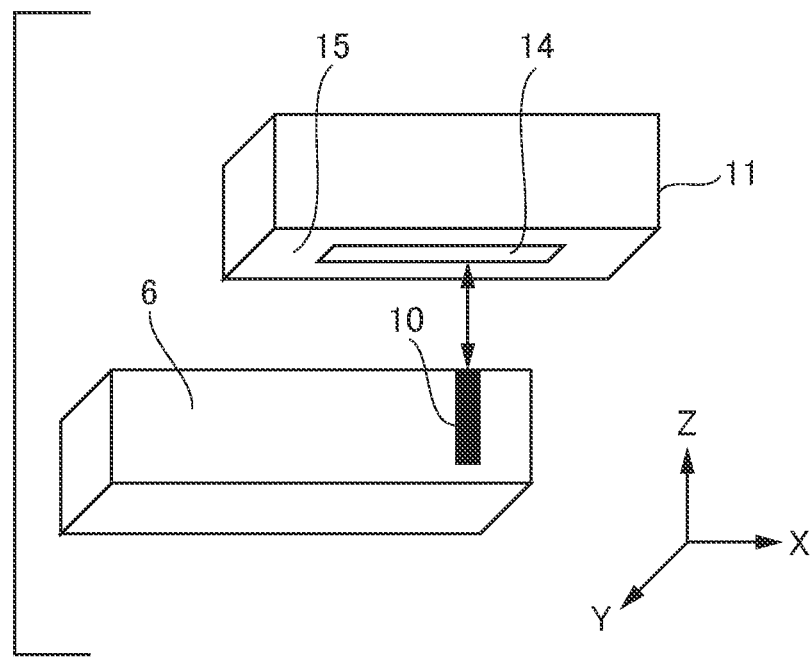
FIG. 3 is a view illustrating a configuration and arrangement of a coating apparatus in the imprint apparatus.
Figure 4:
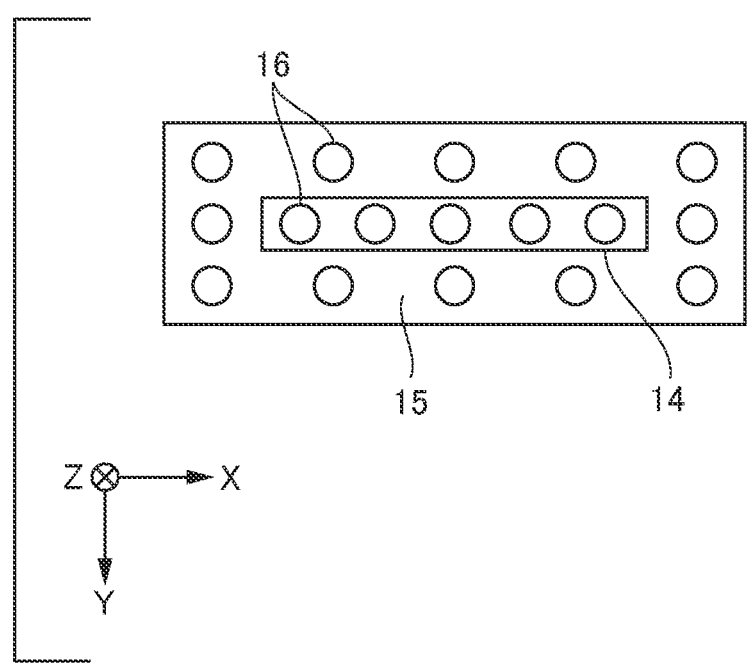
FIG. 4 is a view illustrating a nozzle surface of a dispenser.

FIG. 3 is a schematic perspective view illustrating a configuration and arrangement of the coating apparatus in the imprint apparatus 100. When the thickness of the resin 8 is calculated in step S101, the wafer stage 6 moves such that the position measuring instrument 10 installed on the wafer stage 6 faces the nozzle surface of the dispenser 11. When the position measuring instrument 10 performs measurement, its position becomes a reference position, and specifically is always set to be constant in the Z-axial direction. FIG. 4 is a schematic top view illustrating the nozzle surface of the dispenser 11. The nozzle surface includes the nozzle 14 and a nozzle periphery 15 other than the nozzle 14. The position measuring instrument 10 measures a plurality of measuring points 16 that are schematically represented for the nozzle 14 and the nozzle periphery 15, thereby measuring a height position of the resin 8 attached to each of the measuring points 16. Then, the controller 20 calculates the thickness of the resin 8 attached to the nozzle surface based on information about the height positions measured by the position measuring instrument 10.

Figure 5:
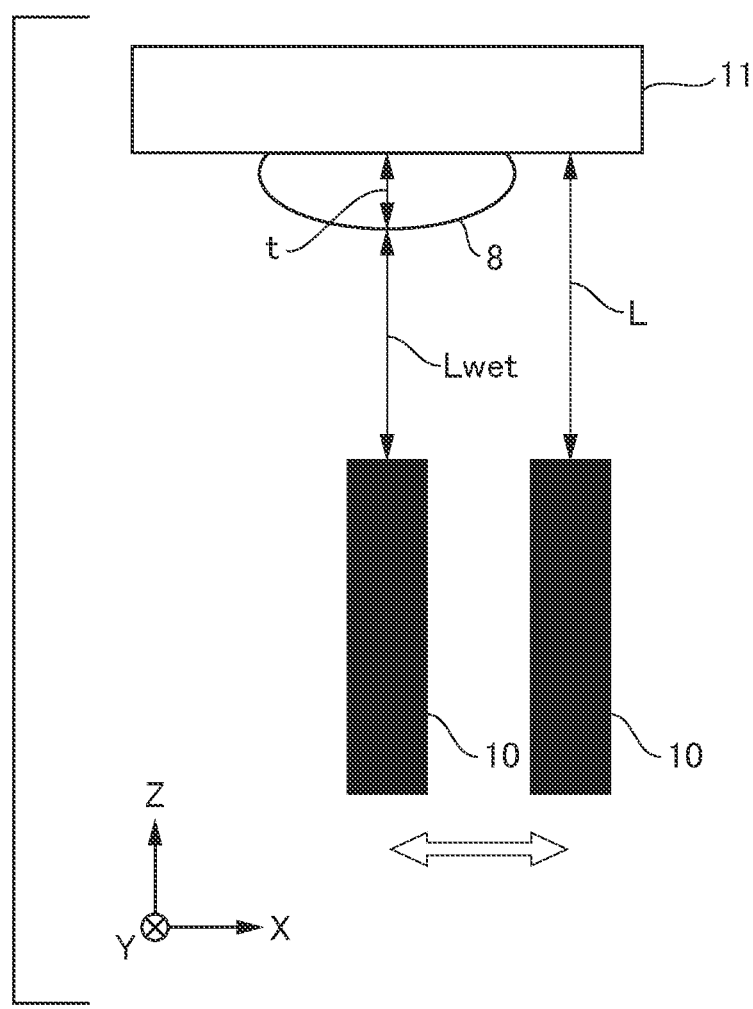
FIG. 5 is a view for describing a principle of height position measurement of a resin attached to the nozzle surface.

FIG. 5 is a schematic side view for describing a principle of the height position measurement of the resin 8 attached to the nozzle surface using the position measuring instrument 10. The position measuring instrument 10 is assumed to be a spectral interferometer. First, the position measuring instrument 10 applies relative broadband light to a measured surface (in the present embodiment, the measuring points 16 set on the nozzle surface (see FIG. 4)), and disperses the reflected light using a diffraction grating. At this time, since the applied light travels without refraction in proportion to a length of a wavelength component, the light reflected from the measured surface travels at different angles by wavelengths, and is detected by a light-receiving device (e.g. a charge-coupled device (CCD)) in the position measuring instrument 10. Here, a certain portion of the light-receiving device receives light having a specific wavelength, and portions adjacent to that portion receive light having longer or shorter wavelengths than the specific wavelength. That is, coordinates of the light-receiving device correspond to a length of the dispersed wavelength. Thus, the interference of light becomes addition of reference light returning at an exit of the light-receiving device and measured light returning after arriving at the measured surface. Therefore, it is found from each strength of the light detected by the light-receiving device which wavelength is strengthened, and thus a distance up to the measured surface, i.e. a height position (measured value), can be finally obtained from the lowest common multiple thereof.

The controller 20 compares the measured value with a reference value obtained when the nozzle surface to which no droplets are attached is measured by the position measuring instrument 10. Here, assuming that the measured value varies from a distance L to a distance $L_{wet}$ (see FIG. 5), when a refractive index of air is defined as $n_1$, a refractive index of the resin 8 is defined as $n_2$, and a thickness of the resin (liquid film) 8 is defined as t, the number of waves $i_{wet}$ on an optical path of measurement light is expressed by Formula (1).

$$i_{wet}=(L-t)/(\lambda/n_1)+t/(\lambda/n_2) \quad (1)$$

On the other hand, the position measuring instrument 10 multiplies the number of waves $i_{wet}$ by a wavelength in air $\lambda n_1$ to convert to the distance, and thus a real measured value $L_{wet}$ is expressed by Formula (2).

$$L_{wet}=i_{wet}\times\lambda n_1=(L-t)+t/(n_1/n_2) \quad (2)$$

Here, for example, when $L_{wet}$=1100 μm, L=100 μm $n_1$=1, and $n_2$=1.4, the thickness t of the resin 8 attached to the measuring points 16 of the nozzle surface is expressed by t=(1100−1000)×1/(1.4−1)=100/0.4=250 (μm) according to Formula (2). In this way, if the distance L is previously measured in the state in which the resin 8 is not attached to the nozzle surface, the thickness t of the resin 8 can be calculated.

In the present embodiment, the position measuring instrument 10 is installed on the wafer stage 6 that is used for the superposition and driving in this way, and thereby can measure each of the measuring points 16 by minute step driving. Accordingly, the controller 20 can perform height mapping of the nozzle surface from results of the measurement at each of the measuring points 16. This mapping includes an advantage that attachment distribution of the resin 8 to the nozzle surface is recognized, and thereby the resin 8 can be efficiently removed, for instance, in a later cleaning process.

Next, the controller 20 determines from the result of the thickness of the resin 8 calculated in step S101 whether the resin 8 is attached to the nozzle surface (step S102). Here, when the controller 20 determines that the resin 8 is not attached to the nozzle surface (No), the controller 20 performs the aforementioned imprint process (imprint process: step S103), and completes all the processes of the imprint method.

On the other hand, when the controller 20 determines that the resin 8 is attached to the nozzle surface in step S102 (Yes), the controller 20 determines whether the thickness of the resin 8 calculated in step S101 is within a preset allowable range (step S104). At this time, the allowable range is previously regulated using whether or not to exert an influence on the discharge operation of the dispenser 11 when the thickness of the resin 8 is equal to or more than the allowable range as a reference. Here, when the controller 20 determines that the thickness of the resin 8 is within the allowable range (Yes), the controller 20 proceeds to step S103, and performs the imprint process. On the other hand, when the controller 20 determines that the thickness of the resin 8 is not within the allowable range (exceeds the allowable range) (No), the controller 20 generates an error as one of the maintenance treatments (step S105), and completes all the processes of the imprint method without proceeding to the imprint process. As a means for generating the error, in addition to a means for directly generating the error such as a warning sound or a warning lamp, a means for displaying the error on a monitor (interface), or a means for sending such information to an external overall controlling means is also included.

Figure 6:
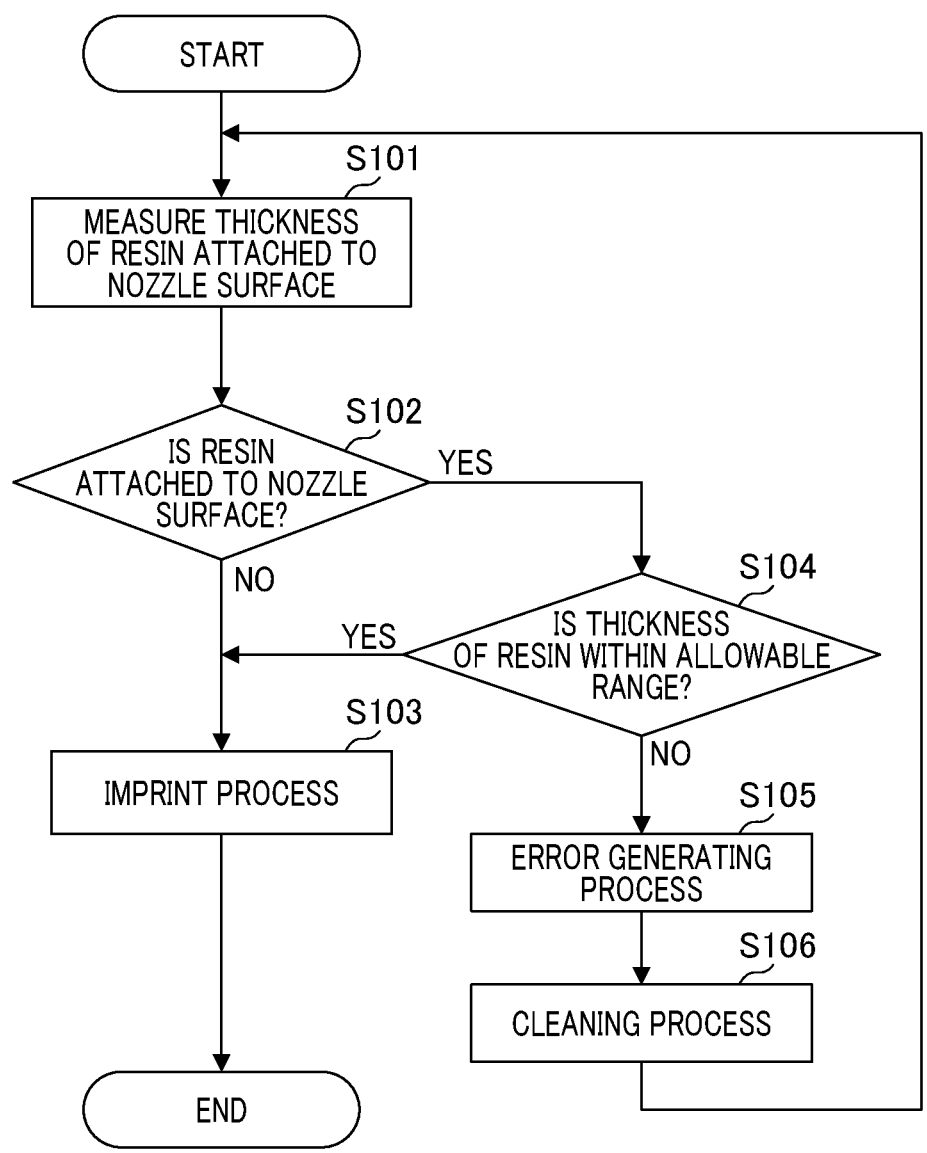
FIG. 6 is a flowchart illustrating a flow of another imprint method.

When it is determined that the thickness of the resin 8 is not within the allowable range in step S104, the error is generated, or in addition to this, cleaning treatment (removal treatment of the resin 8) serving as the maintenance treatment may be further included in the maintenance process. FIG. 6 is a flowchart illustrating a flow of the imprint method including another maintenance process of the dispenser 11 in the present embodiment. The imprint method illustrated in FIG. 6 is different from that illustrated in FIG. 2 in that, when it is determined that the thickness of the resin 8 is not within the allowable range in step S104, the controller 20 performs the cleaning process of removing the resin 8 attached to the nozzle surface (step S106). Further, in FIG. 6, this cleaning process is adapted to be performed after the error generating process of step S105, but this error generating process may not be performed. In this case, after the cleaning process of step S106, the controller 20 returns to step S101, and calculates the thickness of the resin 8 again. Further, a loop count may also be previously limited, for instance, to three times. When the thickness of the resin 8 does not fall within the allowable range even though the cleaning process of step S106 has been performed three times, the imprint method may be forcibly terminated. Further, as the maintenance treatment other than the foregoing, when it is determined that the thickness of the resin 8 is not within the allowable range in step S104, a treatment of simply stopping the imprint apparatus 100 and waiting for a treatment response from a user may be used.

Also, as illustrated in FIG. 1, the imprint apparatus 100 (or the coating apparatus) may have a maintenance area 12 that includes a maintenance unit 13 performing the maintenance or adjustment of the dispenser 11. The maintenance unit 13 includes, for instance, a waste liquid bucket. In addition to cleaning of removing resin 8 attached to the nozzle surface, for instance, when clogging such as a contaminant occurs at the nozzle 14, a purge treatment of discharging a large amount of resin 8 to the waste liquid bucket is performed, and thereby the clogging can be resolved.

Figure 7:
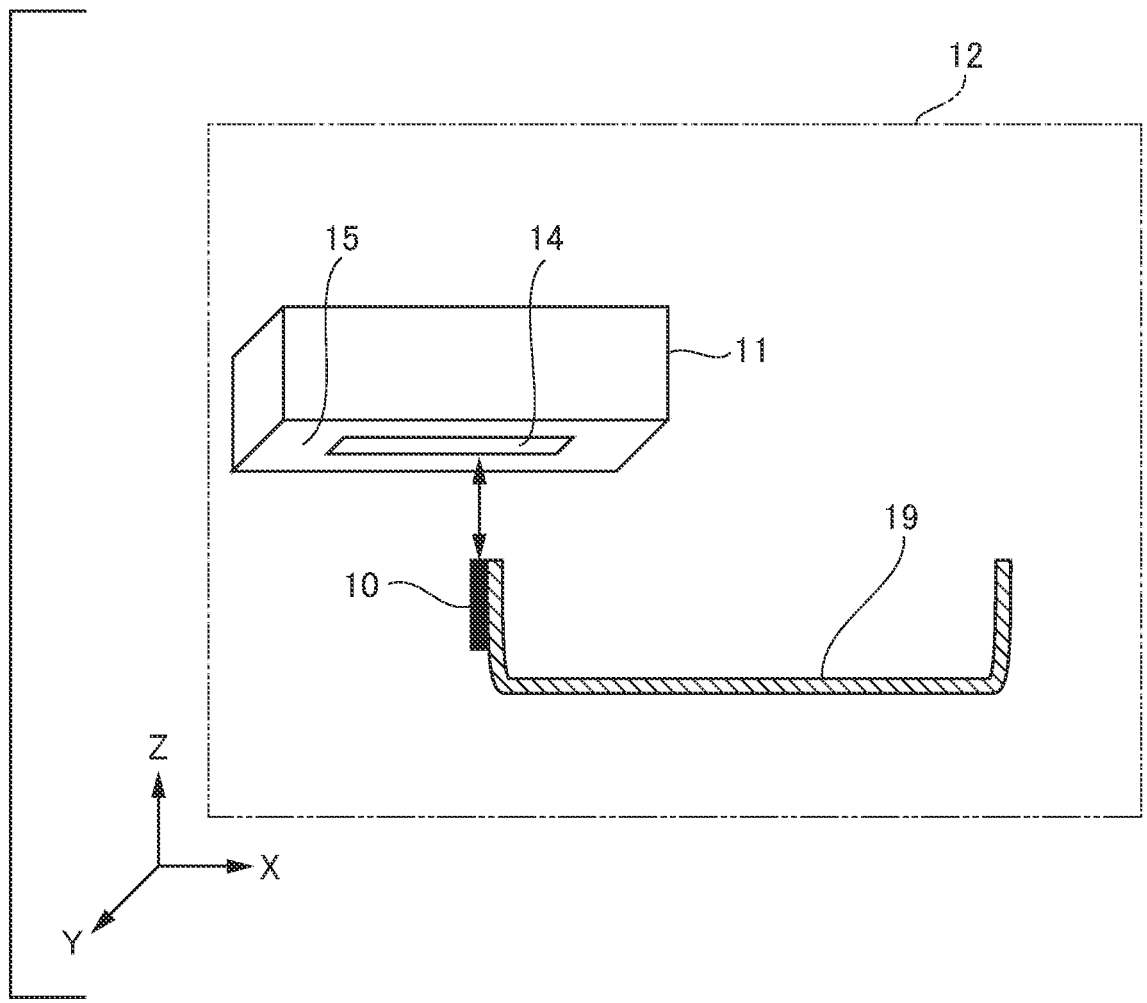
FIG. 7 is a view illustrating a state in which the dispenser moves into a maintenance area.

Here, in the above description, the position measuring instrument 10 is adapted to be installed on the wafer stage 6, but the present invention is not limited thereto. For example, when the maintenance unit 13 includes the waste liquid bucket as described above, the position measuring instrument 10 may be adapted to be installed on the waste liquid bucket. FIG. 7 is a schematic view illustrating a state in which the dispenser 11 moves into the maintenance area 12. In this case, the waste liquid bucket 19 has the position measuring instrument 10 installed to be able to face the nozzle surface of the dispenser 11 within the maintenance area 12. Even with this configuration, like the foregoing, the thickness of the resin 8 attached to the nozzle surface can be calculated. Also, even when a driving direction of the dispenser 11 is only one direction, the waste liquid bucket 19 is provided with a driving mechanism in a direction (Y direction) orthogonal to the driving direction (e.g. X direction) of the dispenser 11, and thereby the height mapping of the nozzle surface can be performed.

In this way, the imprint apparatus 100 (or the coating apparatus included in it) determines whether to perform the maintenance treatment according to the thickness of the resin 8 attached to the nozzle surface of the dispenser 11, i.e. the degree of attachment of the resin 8. Thereby, since it is possible to avoid performing the undue maintenance, an increase in maintenance time (a decrease in operable time) can be suppressed, and damage to the nozzle surface can be further reduced.

As described above, according to the present embodiment, it is possible to provide a coating apparatus and an imprint apparatus advantageous to optimization of the maintenance treatment.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of the present embodiment has an advantage, as compared with a conventional method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-248742 filed Dec. 9, 2014, which is hereby incorporated by reference herein in its entirety.

What is claimed is:

1. A coating apparatus having a discharge unit for discharging a photocurable resin onto an object, the coating apparatus comprising:

a measurement unit that is disposed at a position facing a discharge surface of the discharge unit and measures a height of the discharge surface using first light which is different to second light curing the photocurable resin; and a controller that determines implementation of a maintenance treatment based on the height of the discharge surface which is measured by the measurement unit using the first light which is different to the second light.

2. The coating apparatus according to claim 1, wherein the controller that calculates a thickness of a substance attached to the discharge surface, wherein the substance contains the photocurable resin, the calculation being based on the height measured by the measurement unit using a refractive index of the photocurable resin, wherein the controller determines implementation of a maintenance treatment based on the calculated thickness of the attached substance.

3. The coating apparatus according to claim 2, wherein the controller calculates the thickness of the attached substance based on the height of the discharge surface which the measurement unit previously measures when the attached substance is not attached and the height of the discharge surface which the measurement unit measures after the photocurable resin is discharged.

4. The coating apparatus according to claim 1, wherein the controller causes the measurement unit to measure a plurality of measuring points set on the discharge surface while making the facing position as a reference position invariable and changing a relative position between the measurement unit and the discharge unit.

5. The coating apparatus according to claim 4, wherein the controller sets the plurality of measuring points for a discharge opening in the discharge surface and a periphery of the discharge opening.

6. The coating apparatus according to claim 4, wherein the controller performs mapping of the discharge surface based on a result obtained by the measurement unit measuring the plurality of measuring points.

7. The coating apparatus according to claim 2, wherein the controller is configured to:
previously hold information about an allowable range of the thickness of the attached substance; and
implement the maintenance treatment when the thickness of the attached substance obtained by the measurement of the measurement unit exceeds the allowable range.

8. The coating apparatus according to claim 7, wherein the maintenance treatment includes generating an error.

9. The coating apparatus according to claim 7, wherein the maintenance treatment includes stopping the coating apparatus.

10. The coating apparatus according to claim 7, wherein the maintenance treatment includes a cleaning treatment of the discharge surface.

11. The coating apparatus according to claim 1, wherein:
the coating apparatus has a holder for holding the object; and
the measurement unit is installed on the holder.

12. The coating apparatus according to claim 1, wherein:
the coating apparatus has a waste liquid bucket for receiving the photocurable resin discharged from the discharge opening when a treatment of resolving clogging of the discharge opening of the discharge unit is performed; and
the measurement unit is installed on the waste liquid bucket.

13. The coating apparatus according to claim 1, wherein the measurement unit is a spectral interferometer.

14. An imprint apparatus for forming a pattern to a photocurable resin on a substrate using a mold, the imprint apparatus comprising:
a discharge unit that discharges the photocurable resin on the substrate;
a measurement unit that is disposed at a position facing a discharge surface of the discharge unit and measures a height of the discharge surface using first light which is different to second light curing the photocurable resin; and
a controller that determines implementation of a maintenance treatment based on the height of the discharge surface which is measured by the measurement unit using the first light which is different to the second light.

15. The imprint apparatus according to claim 14, wherein:
the imprint apparatus has a height measurement unit for measuring a height of the mold; and
the measurement unit is used in combination with the height measurement unit.

16. The imprint apparatus according to claim 14, wherein:
the controller that calculates a thickness of a substance attached to the discharge surface, wherein the substance contains the photocurable resin, the calculation being based on the height measured by the measurement unit using a refractive index of the photocurable resin, wherein the controller determines implementation of a maintenance treatment based on the calculated thickness of the attached substance.

17. A method of manufacturing an article, the method comprising steps of:
forming a pattern to an imprint material on a substrate using an imprint apparatus,
wherein the imprint apparatus includes:
a discharge unit that discharges the imprint material on the substrate;
a measurement unit that is disposed at a position facing a discharge surface of the discharge unit and measures a height of the discharge surface using first light which is different to second light curing the photocurable resin; and
a controller that determines implementation of a maintenance treatment based on the height of the discharge surface which is measured by the measurement unit using the first light which is different to the second light.

* * * * *